(12) United States Patent
Martinson et al.

(10) Patent No.: US 7,604,486 B2
(45) Date of Patent: Oct. 20, 2009

(54) LATERAL FORCE COUNTERING LOAD MECHANISM FOR LGA SOCKETS

(75) Inventors: Robert R. Martinson, Hillsboro, OR (US); Yupeng Li, Chandler, AZ (US); Tieyu Zheng, Chandler, AZ (US); Mandy G. Mistakawi, Portland, OR (US); Thomas G. Ruttan, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/614,885

(22) Filed: Dec. 21, 2006

(65) Prior Publication Data

US 2008/0151511 A1 Jun. 26, 2008

(51) Int. Cl.
*H01R 12/00* (2006.01)
(52) U.S. Cl. .................... 439/70; 439/331; 439/342
(58) Field of Classification Search ............. 439/70, 439/331, 342
See application file for complete search history.

(56) References Cited

U.S. PATENT DOCUMENTS

| | | | | | |
|---|---|---|---|---|---|
| 4,930,561 | A | * | 6/1990 | Clay | 160/229.1 |
| 5,702,256 | A | | 12/1997 | Severn | |
| 6,607,066 | B1 | * | 8/2003 | Andersen et al. | 198/370.04 |
| 6,699,047 | B1 | * | 3/2004 | McHugh et al. | 439/71 |
| 6,848,936 | B2 | * | 2/2005 | DeFord | 439/526 |
| 6,908,316 | B2 | * | 6/2005 | Ma et al. | 439/73 |
| 6,974,332 | B2 | | 12/2005 | Ma | |
| 7,118,385 | B1 | | 10/2006 | Bodenweber et al. | |
| 7,121,865 | B2 | | 10/2006 | Bryant | |
| 7,128,593 | B2 | | 10/2006 | Ma | |
| 7,134,898 | B2 | * | 11/2006 | Ma | 439/342 |
| 2005/0130478 | A1 | | 6/2005 | Ma | |
| 2005/0196982 | A1 | * | 9/2005 | Cao et al. | 439/70 |

FOREIGN PATENT DOCUMENTS

EP 0878033 11/1998

OTHER PUBLICATIONS

Intel Corporation, et al., PCT Search Report and Written Opinion mailed May 15, 2008, PCT/US2007/024487.

* cited by examiner

*Primary Examiner*—Tho D Ta
(74) *Attorney, Agent, or Firm*—Blakely, Sokoloff, Taylor & Zafman LLP

(57) ABSTRACT

Apparatus including a body as an intermediary between a device and a printed circuit board, the body including a contact area defined by a plurality of openings each to accommodate a contact therethrough and an alignment feature adjacent the contact area and protruding from a plane defined by the contact area, wherein a surface of the alignment feature includes a friction-reducing material. A method including contacting an alignment feature of a socket with a friction-reducing material. Apparatus and system including a body as an intermediary between a device and a printed circuit board; a plurality of contacts each disposed through a contact area of the body and oriented to deflect a device in a first direction; and a load plate coupled to the body and configured to apply an actuation force on a device in a different second direction. A method including inserting a device into a socket.

13 Claims, 5 Drawing Sheets

LATERAL FORCE COUNTERING LOAD MECHANISM FOR LGA SOCKETS

BACKGROUND

1. Field

Semiconductor packaging.

2. Description

Land Grid Array (LGA) packaging technology offers many advantages in terms of device manufacturing, high I/O density, low inductance, ease of upgrade, and cost.

An LGA socket is typically used to attach a LGA device such as a packaged chip to a printed circuit board (PCB). The typical loading required for LGA contact deflection generates lateral device (e.g., package) displacement driven by contact-to-device frictional forces. Package lateral displacement may continue until the device (e.g., package) comes in contact with the socket sidewall. Subsequently, frictional forces are generated between the device and the socket sidewall that can result in electrical opens or package damage through, for example, deformation to the device sidewalls or even breaking them.

Existing techniques to reduce the resultant friction force and moment during socket actuation have a number of drawbacks. Most LGA sockets or connectors have the LGA contacts wiping in one direction. While this configuration may be acceptable when the number of contacts is a few hundred, the resultant friction force and moment become significant when the number of contacts exceeds 1,000. Another technique lays out the LGA contacts into two diagonal triangular areas on a square socket with a square central cavity. However, when the socket or the central cavity is not square, some amount of moment results in reaction forces on the socket sidewall. In addition, the number of contacts in each row may be different in one area, causing complexities in manufacturing.

BRIEF DESCRIPTION OF THE DRAWINGS

Embodiments may best be understood by referring to the following description and accompanying drawings that are used to illustrate embodiments. In the drawings.

DETAILED DESCRIPTION

Figure 1:
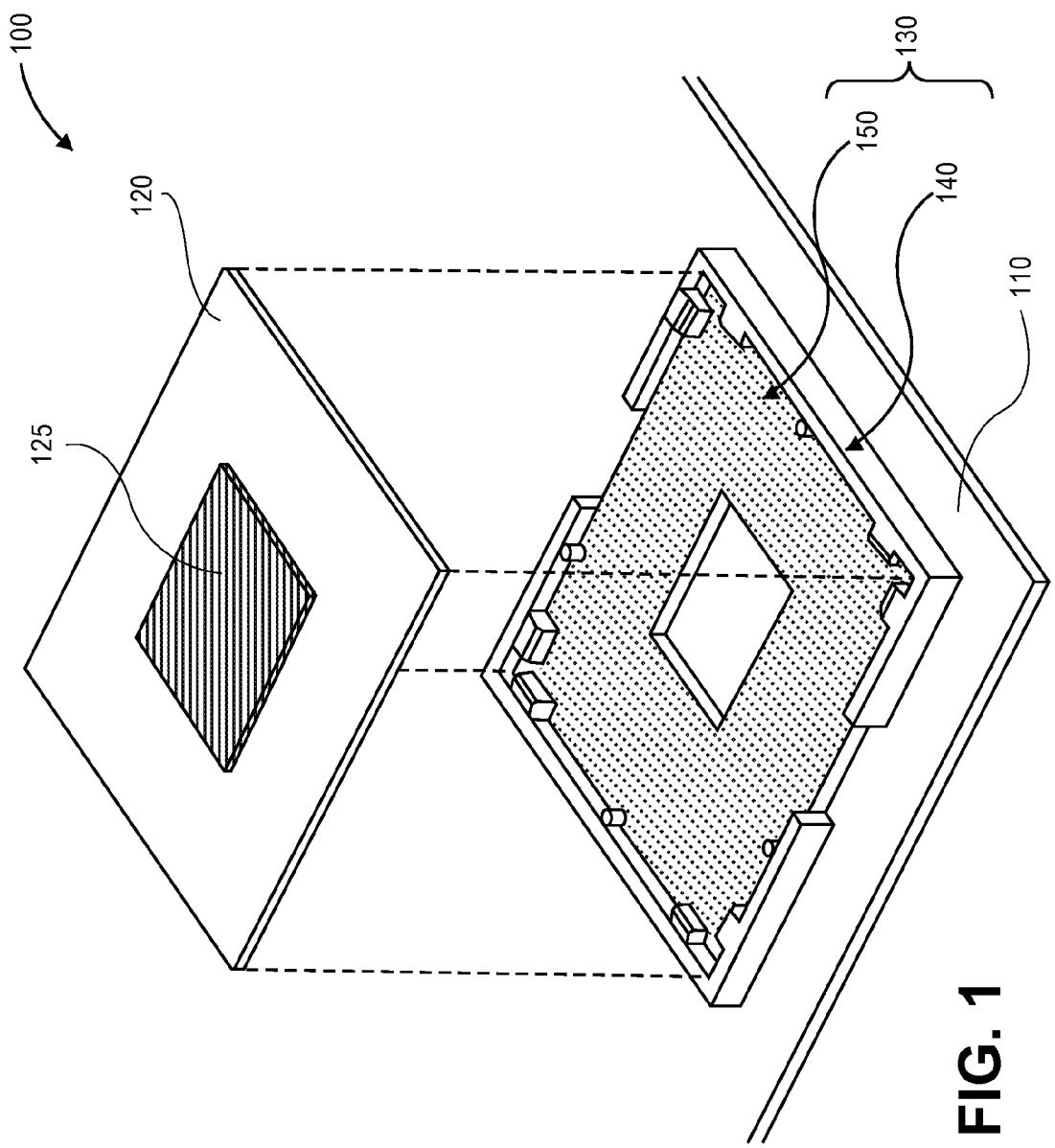
FIG. 1 is an exploded top view of an embodiment of an assembly including socket and a device (e.g., package and chip) to be positioned within the socket.

FIG. 1 illustrates a top partially exploded view of a representation of an integrated circuit system that might be used, for example, in a computing device, wireless communication device, computer-related peripheral, or entertainment device. In this embodiment, system 100 includes printed circuit board (PCB) 110, device 120, and socket 130.

PCB 110 is any PCB that may contain circuits and devices used in a processing system. PCB 110 may be a multi-layer board made of materials such as epoxy and FR4. It may include copper clad, microwave, and rigid and/or flexible laminates, etc. It typically meets a broad range of thermal and electrical requirements of various systems. It may be a motherboard or a main board in a computer system, an expansion board that plugs into an expansion slot, a daughter card that is attached directly to another board, or an adapter that contains special devices or processors such as video, graphics, network, etc. PCB 110 is typically populated with many devices having various packaging type such as surface mount, ball grid array (BGA), microBGA, pin grid array (PGA), Land Grid Array (LGA), small outline integrated circuit (SOIC), quad flat pack (QFP), Thin Small Outline Package (TSOP), Chip Carrier (CC), Chip Scale Package (CSP), etc. PCB 110 had traces, pads, vias and other elements to provide electrical connections that connect devices or components together.

Device 120 is any device that is encapsulated with a proper package compatible with socket 130. In particular, device 120 is packaged with a LGA package. Typically device 120 has a very high pin count, ranging from several hundred pins to over a thousand pins. FIG. 1 shows device 120 as a LGA package including chip 125. Chip 125 may be, for example, a microprocessor, a digital signal processor, a network processor, a graphics co-processor, a floating-point co-processor, a micro-controller, an integrated controller hub, or any complex device.

Socket 130 is used to hold device 120 firmly and provide electrical contacts between device 120 and PCB 110 (e.g., an intermediary between the device (e.g., package and chip) and the PCB). It is mounted on PCB 110 (and provides electrical contact with PCB 110) through a re-flow soldering process or any other mounting techniques. Socket 130 provides mechanical, thermal, and electrical support to allow device 120 to be attached to PCB 1 10. It may include housing 140 and contact area 150. Housing 140 is a frame to provide mechanical encapsulation for the device. Contact area 150 contains contacts to provide electrical connections between PCB 110 and the pads on device 120 when device 120 is inserted into socket 130. When fully inserted, device 120 typically occupies substantially all of the inner surface of socket 130 within housing 140. Socket 130 is designed to be compatible with an LGA device. However, an embodiment may be used for other types of sockets as long as there are a number of contacts that provide electrical connection between a PCB and a device when the device is inserted into the socket.

Figure 2:
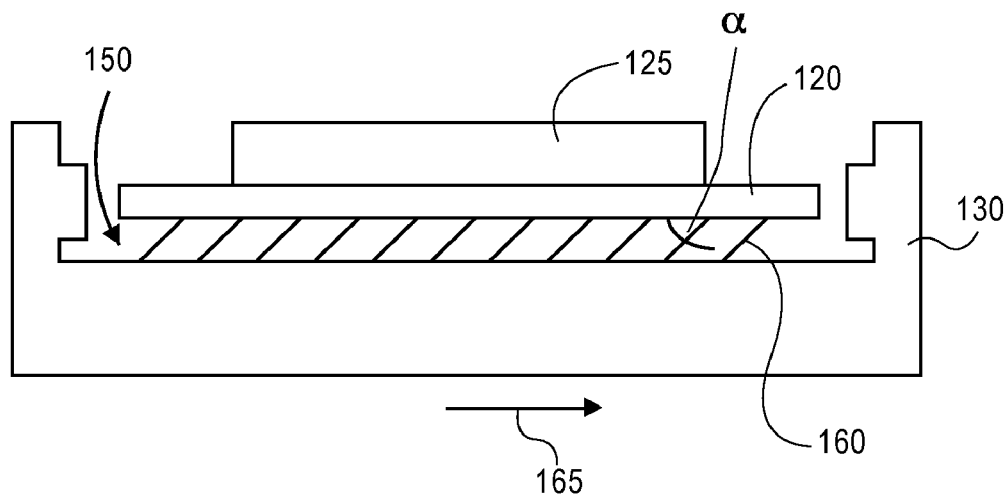
FIG. 2 shows a schematic side view of an assembly including a device positioned over a contact area of the socket prior to electrical connection between the device and the socket.
Figure 3:
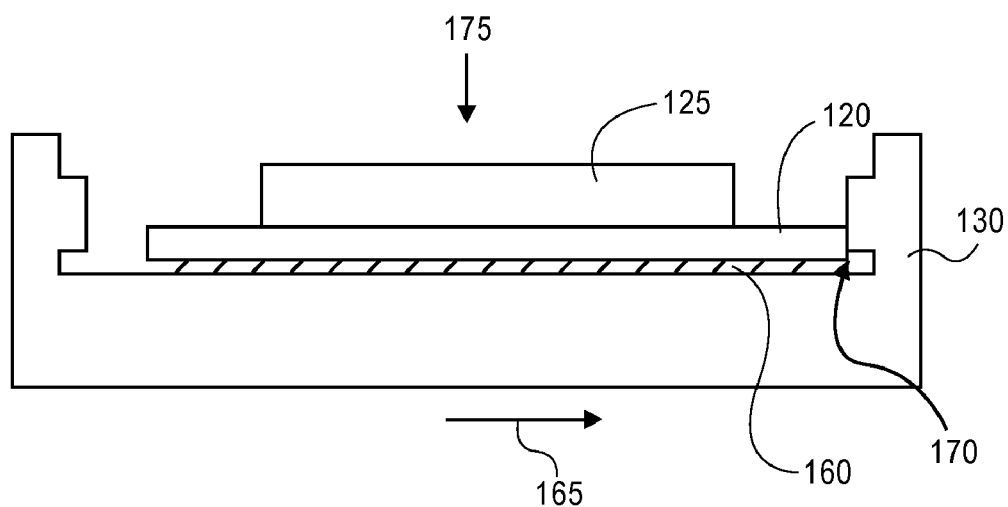
FIG. 3 shows the assembly of FIG. 2 following the electrical connection of the device and the socket.

FIG. 2 and FIG. 3 schematically illustrate the locating and placement of device 120 into socket 130 such as an LGA socket. FIG. 2 shows device 120 positioned within socket 130 (i.e., within housing 140) and occupying an area substantially equivalent to contact area 150. Electrical connection between device 120 and socket 130 at this point has not been made. FIG. 2 shows device 120 including a number of contacts 160 extending from a surface opposite the surface including chip 125. Contacts 160 extend from the surface of socket 130 (an upper surface as viewed) at an angle, α, that is less than 90 degrees. In this way, when a force is applied normal or perpendicular to a surface of device 120 (the upper surface as viewed), device 120 actuates laterally as shown by actuation force 165 as the contacts are placed in socket 130.

FIG. 3 shows contacts 160 electrically connected to socket 130. FIG. 3 also shows the contacting of device 120 with a sidewall of socket 130 (at contact point 170). The contact of device 120 with a sidewall of socket 130 causes a friction force between device 120 (the package of device 120) and socket 130. When friction force 170 is higher than an insertion force, device 120 cannot be placed into socket 130. If the friction force is higher than the yield strength of device 120, however, then device 120 will yield causing package damage and possibly electrical signal loss between chip 125 and socket 130.

Figure 4:
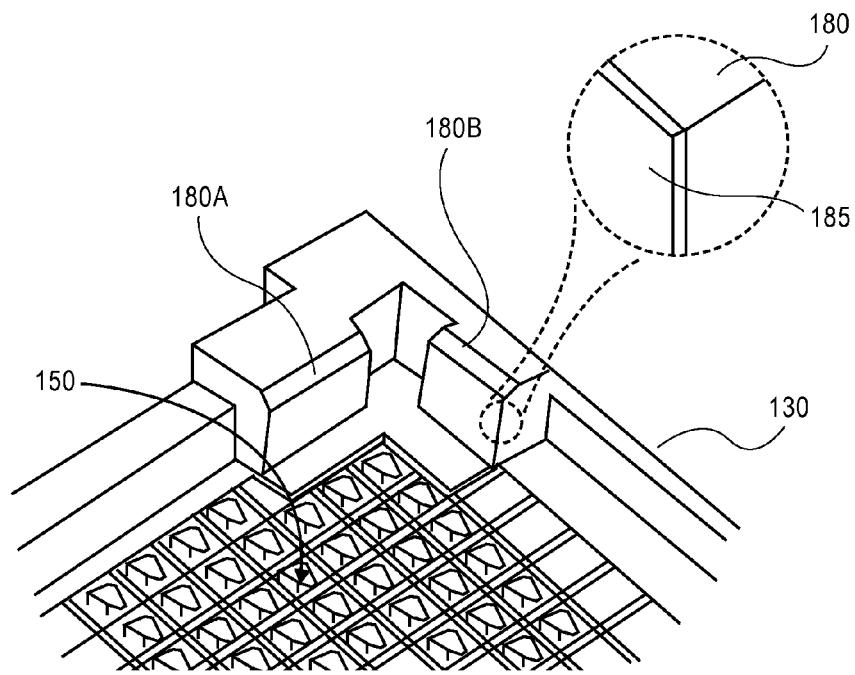
FIG. 4 shows a magnified view of a portion of the socket of FIG. 1 and shows a friction-reducing material on the package-locating sidewall feature.

In one embodiment, friction force 170 is reduced by incorporating or applying a friction-reducing material into/onto socket 130 (e.g., on one or more of the sidewalls of socket 130 that define contact area 150). FIG. 4 shows a magnified view of one corner of socket 130 and illustrates package-locating sidewall feature or datum 180A and package-locating sidewall feature or datum 180B that are used as alignment features to position device 120 within socket 130 and that define contact area 150. In one embodiment, socket 130 includes datum 180A and datum 180B that are made of a low-friction material surface or coated with a friction-reducing material/lubricant. In one embodiment, a material for datum 180A and datum 180B or a material layer on datum 180A and datum 180B (e.g., material layer 185) is selected such that it can withstand a solder melt temperature (SMT) that would be used to bond socket 130 to a PCB. One suitable material is a polytetrafluoroethylene, such as TEFLON®. A metallic material would also be suitable. In the embodiment shown in FIG. 4, an inset shows material layer 185 of a friction-reducing material/lubricant a polytetrafluoroethylene, such as TEFLON® coated on a sidewall of datum features 180 where a device may be actuated against the sidewall. A friction-reducing material may be used to fabricate socket 130 such as by molding socket 130 of a friction-reducing material. Alternatively, socket 130 may be made of a material (e.g., plastic material) that may not have friction-reducing material properties and the data of the socket may be coated, such as by spraying or dipping with a friction-reducing material.

Friction may be described as the coefficient of friction (COF) time a force (i.e., resultant normal force perpendicular to the friction surface). A typical COF between a device (e.g., a chip package) and a socket housing a 0.3 to 0.4. The typical COF between a device and TEFLON coated polymer is 0.04 to 0.1. Thus, by using a friction-reducing material such as TEFLON, the friction force can be reduced by 70 percent to 80 percent thus easing insertion of a device into a socket and significantly reducing the chance to damage the device (i.e., the package).

Figure 5:
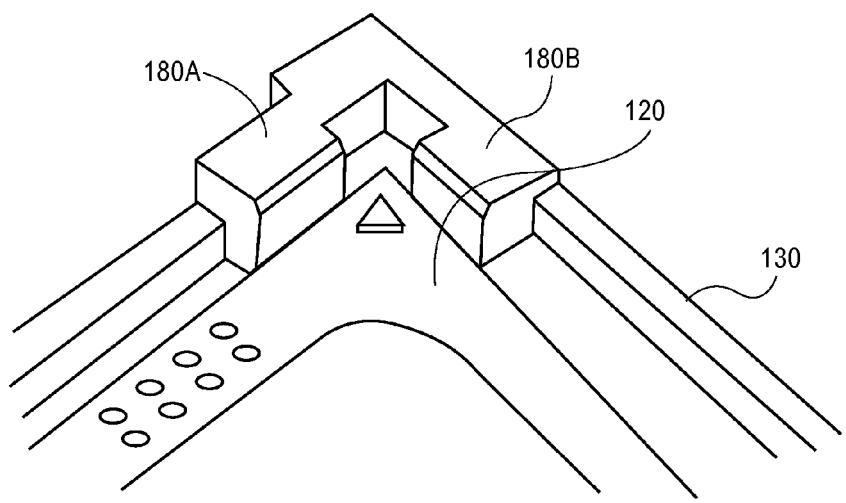
FIG. 5 shows the magnified view of a portion of the socket of FIG. 1 and shows a device (e.g., package and chip) positioned in the socket.

FIG. 5 shows device 120 positioned within socket 130 and adjacent (contacting) sidewall surfaces of datum 180A and datum 180B. The low friction force material of datum 180A and datum 180B will inhibit the ability of device 120 from binding against the socket sidewall during package installation and subsequent loading. By inhibiting the aforementioned binding, electrical opens and package damage failure mechanism are minimized.

The above embodiment has been described with respect to a LGA socket. It is appreciated that the embodiment may have application for alternate designs. It may be, for example, have applications in PGA-style socket where frictional forces need to be overcome to actuate the socket/package interconnect.

As noted above, the typical loading for LGA contact deflections generate lateral device (e.g., package) displacement driven by contact-to-device frictional forces. Device lateral displacement occurs until the device substrate (e.g., package) comes in contact with a socket sidewall. Subsequently, frictional forces are generated between the substrate and the socket sidewall that can result in electrical opens or device damage (e.g., package damage). Utilizing friction-reducing material on one or more of the package datum may minimize the frictional force. Alternatively, or additionally, the package may be configured so that an opposing force vector may be applied during device loading that reduces a friction force associated with device loading.

Figure 6:
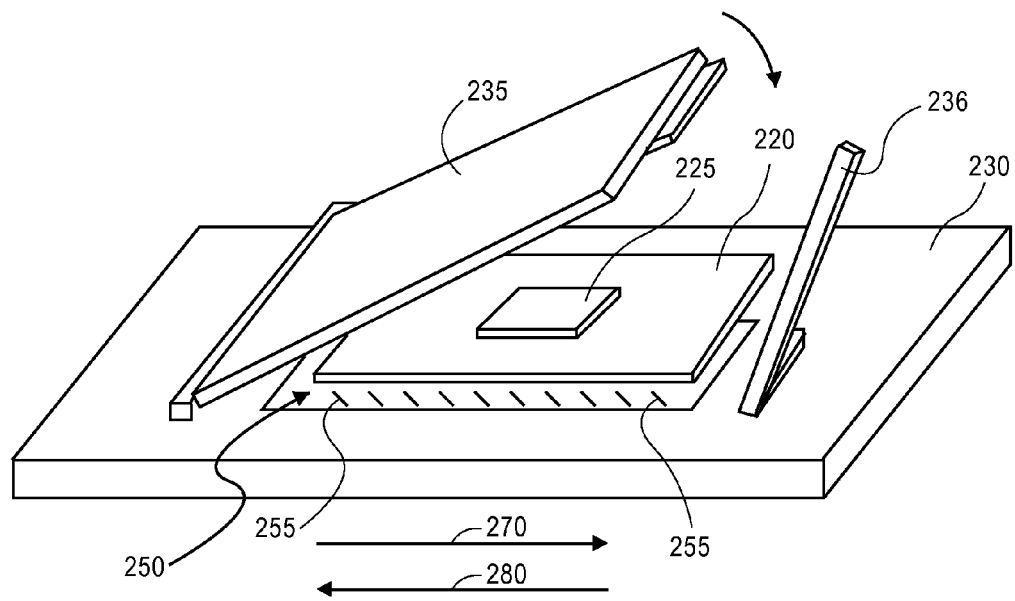
FIG. 6 shows a schematic top side view of an assembly including a hinged socket with a hinged door in a partially opened position and a device (e.g., package and chip) positioned above a contact area of the socket.

FIG. 6 shows an embodiment of a hinged-device-socket-loading mechanism in an unloaded state with device 220 position to be loaded into socket. Representatively, socket 230 is a direct load socket such as an LGA775 SKT DSL or an independent loading mechanism such as SKT B ILM. Socket 230 includes, in this embodiment, contact area 260 including contacts 255 to provide electrical connection between a PCB (not shown) and pad on device 220 when device 220 is inserted into socket 230. Socket 230 also includes hinged door 235 and locking arm 236. When device 220 is positioned within socket 230 (within contact area 250), hinged door 235 is rotated downward (clockwise as shown toward a contact area) and is used to apply an actuation force (illustrated by arrow 270) to device 220 and to secure the device in the socket. Locking arm 236 is then rotated downward (counterclockwise as shown) to secure hinged door 235 in place on device 220.

In one embodiment, contacts 255 of socket 230 are configured such that where device 220 (e.g., of a chip in package) is placed into contact area 250 and a force applied to electrically connect contact pads on device 220 with contacts 255, the contact force will be in a direction (illustrated by arrow 280) opposite actuation force 270 of hinged door 235. In this manner, device 220 will be actuated toward the hinge of hinged door 235. The force vectors represented by arrow 270 and arrow 280 will offset one another thereby minimizing contact frictional forces. It is appreciated that contacts 255 are typically placed in socket 230 once the socket is formed. Thus, at such point, the orientation of contacts may be selected.

Figure 7:
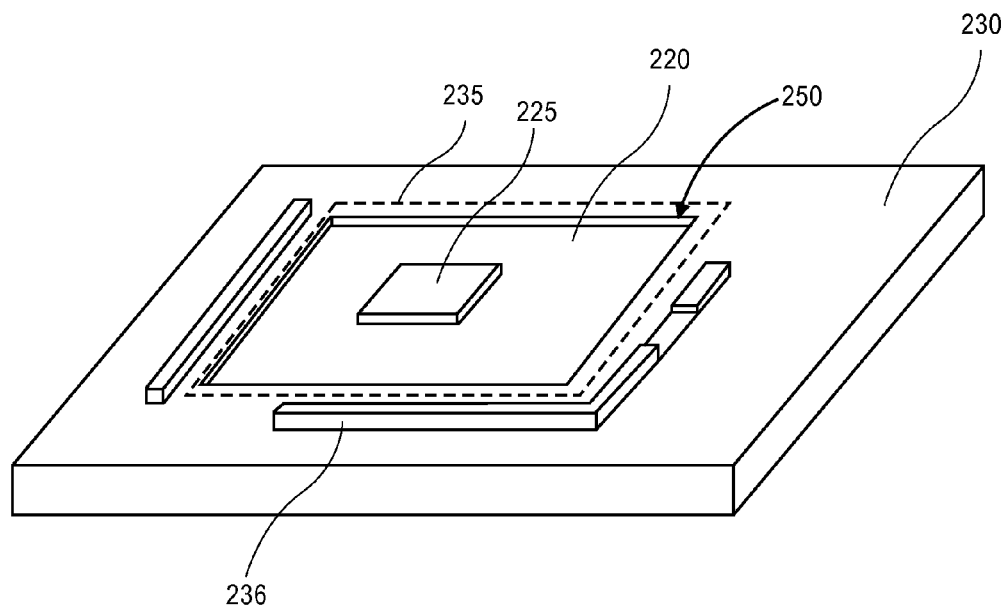
FIG. 7 shows the assembly of FIG. 6 with the device loaded into the socket and the hinged door closed.

FIG. 7 shows device 220 positioned in contact area 250 with contacts 255 (not shown) providing an electrical connection between contact pads on device 220 and a PCB to which socket 230 may be attached. FIG. 7 shows hinged door 235 in ghost lines.

In the above embodiments described with reference to FIGS. 6 and 7, opposing force orientations are utilized between a hinged socket loading mechanism and a contact deflection direction. This may be achieved with a direct socket load socket by designing a socket and loading mechanism to support offsetting force vectors. Sockets may be formed by molding the housing, inserting contacts, applying solder balls, and attaching a pick and place cap. The loading mechanism may then be fabricated and attached to the socket adhering to an opposing force configurations described above. The socket may then be soldered to a printed circuit board and a device, such as a package containing a chip inserted into a contact area of the socket and the socket loading mechanism actuated. For an independent loading mechanism, the socket and loading mechanism may be designed to support offsetting vectors, with the socket fabricated and soldered to the PCB. The loading mechanism may then be attached on a device such as a package and the package inserted into a contact area of the socket and the socket loading mechanism actuated.

Figure 8:
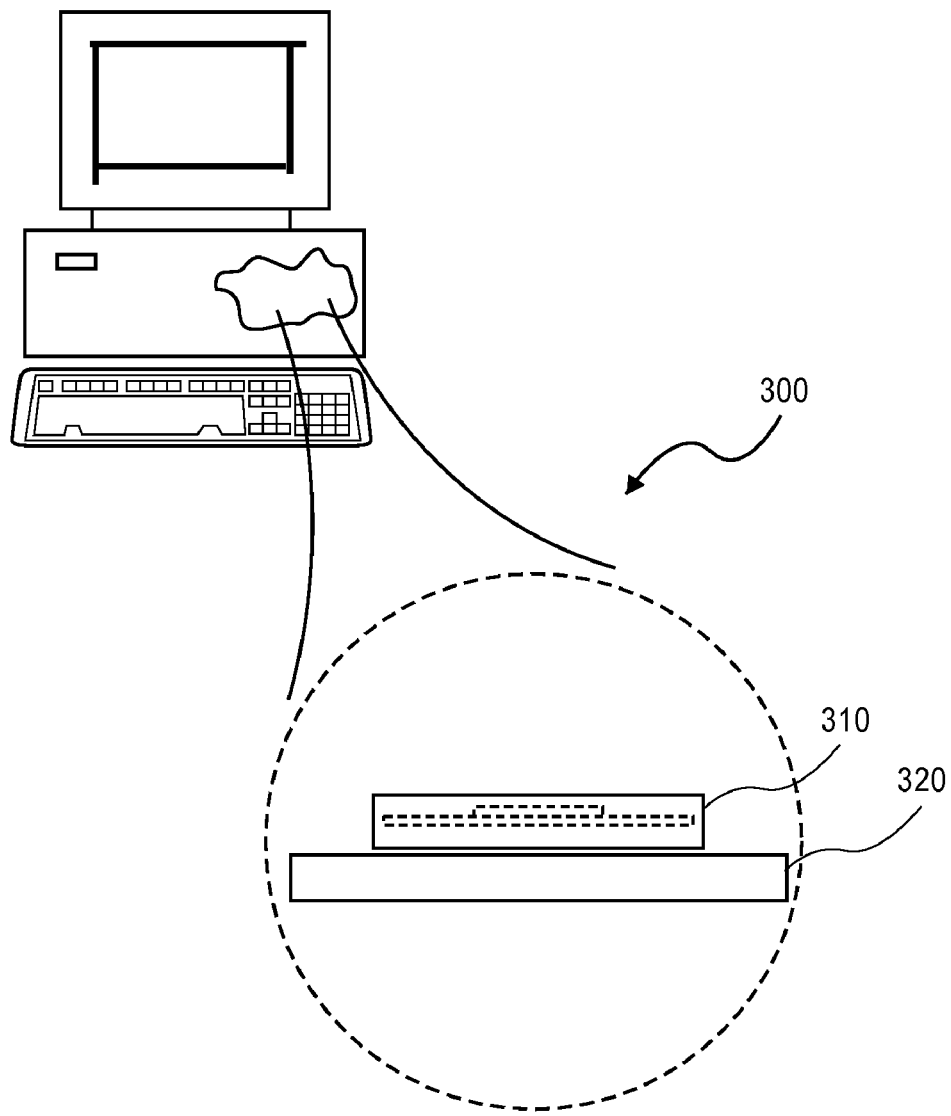
FIG. 8 shows a computer system including a socket mounted on a printed circuit board.

FIG. 8 shows a cross-sectional side view of a socket including an integrated circuit package that is physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tape and compact disc player, video cassette recorder, MP3 (motion picture experts group, audio layer 3 player, etc.), and the like. FIG. 8 illustrates the electronic assembly is part of a desktop computer. FIG. 8 shows electronic assembly 300 including socket 310, configured as described in one or more embodiment described with reference to FIGS. 1-7 and the accompanying text, physically and electrically connected to printed circuit board 820 such as a motherboard or other circuit board. Socket 810 includes a packaged chip. Electrical contact points, e.g., contact pads on a surface of the chip are connected to the package through, for example, a conductive bump layer. Electrical contact points of socket 310 may be similarly soldered to printed circuit board 320. The package is electrically connected to socket 310 through contacts as described above.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. An apparatus comprising:
   a land grid array (LGA) body having dimensions suitable to accommodate an integrated circuit (IC) device and serve as an intennediary between the IC device and a printed circuit board, the LGA body comprising a contact area defined by a plurality of openings, each to accommodate a contact therethrough, one or more sidewalls surrounding the contact area, and an alignment feature adjacent the contact area and protruding from a plane defined by the contact area for positioning the IC device within the LGA body, the alignment feature formed within a sidewall of the LGA body, proximate a corner of the LGA body,
   wherein a surface of the alignment feature extends parallel to the sidewall of the body, and the surface comprises a friction-reducing material for reducing friction forces generated between the I/C device and the sidewalls during positioning of the I/C device within the LGA body.

2. The apparatus of claim 1, wherein the alignment feature comprises a first material and the friction-reducing material comprises a different second material.

3. The apparatus of claim 1, wherein the friction-reducing material is applied to the surface of the alignment feature.

4. The apparatus of claim 1, wherein the friction-reducing material is stable at a projected processing temperature to which the apparatus may be exposed.

5. The apparatus of claim 1, wherein the friction-reducing material comprises polytetrafluoroethylene.

6. The apparatus of claim 1, wherein the friction-reducing material comprises a metallic material.

7. An apparatus comprising:
   a land arid array (LGA) body having dimensions suitable to accommodate a circuit device and serve as an intermediary between the device and a printed circuit board, the LGA body comprising a contact area defined by a plurality of contact openings, one or more sidewalls surrounding the contact area, and an alignment feature adjacent the contact area and protruding from a plane defined by the contact area, the alignment feature formed within a sidewall of the LGA body, proximate a corner of the LGA body for positioning the circuit device within the LGA body;
   a plurality of contacts each disposed through respective ones of the plurality of contact openings and each comprising a mating portion oriented to wipe a contact of a circuit device in a first direction; and
   a load plate coupled to the body and configured to apply an actuation force on a circuit device in a second direction that is different than the first direction,
   wherein a surface of the alignment feature extends parallel to the sidewall of the body, and the surface comprises a friction-reducing material for reducing friction forces generated between the circuit device and the sidewalls during positioning of the circuit device within the LGA.

8. The apparatus of claim 7, wherein the second direction differs from the first direction by 180 degrees.

9. The apparatus of claim 7, wherein the load plate is coupled to the body at one end through a hinged coupling and the second direction is a direction away from the hinged coupling.

10. The apparatus of claim 7, wherein the load plate is coupled to the body at one end through a hinged coupling and, when a circuit device is loaded into the apparatus, the circuit device is biased toward the hinged coupling.

11. A system comprising:
    a printed circuit board;
    a circuit device; and
    a land grid array (LGA) socket mounted on the printed circuit board and functioning as an intermediary between the circuit device and the printed circuit board, the LGA socket comprising a contact area defined by a plurality of contacts, one or more sidewalls surrounding the contact area, and an alignment feature adjacent the contact area and protruding from a plane defined by the contact area for positioning the circuit device within the LGA socket body, the alignment feature formed within a sidewall of the LGA socket, proximate a corner of the LGA socket,
    wherein each of the plurality of contacts comprises a mating portion oriented to wipe a contact of a circuit device in a first direction away from the alignment feature, the socket further comprising one of a friction reducing material on the alignment feature and a load plate to apply an actuation force on the circuit device in a second direction that is different than the first direction, and
    wherein a surface of the alignment feature extends parallel to the sidewall of the LGA socket, and the surface comprises a friction-reducing material for reducing friction forces generated between the circuit device and the sidewalls during positioning of the circuit device within the LGA socket.

12. The system of claim 11, wherein where the socket comprises a friction reducing material, the friction reducing material is stable at a projected processing temperature to which the apparatus may be exposed.

13. The system of claim 11, wherein where the socket comprises a load plate, the second direction differs from the first direction by 180 degrees.

* * * * *

UNITED STATES PATENT AND TRADEMARK OFFICE
CERTIFICATE OF CORRECTION

| | | |
|---|---|---|
| PATENT NO. | : 7,604,486 B2 | Page 1 of 1 |
| APPLICATION NO. | : 11/614885 | |
| DATED | : October 20, 2009 | |
| INVENTOR(S) | : Martinson et al. | |

It is certified that error appears in the above-identified patent and that said Letters Patent is hereby corrected as shown below:

In column 5, at line 32 delete, "intennediary" and insert --intermediary--.

Signed and Sealed this

Eighth Day of June, 2010

David J. Kappos
*Director of the United States Patent and Trademark Office*